(12) United States Patent
Mitchell et al.

(10) Patent No.: US 8,076,587 B2
(45) Date of Patent: Dec. 13, 2011

(54) PRINTED CIRCUIT BOARD FOR HARSH ENVIRONMENTS

(75) Inventors: David J. Mitchell, Oviedo, FL (US); Anand A. Kulkarni, Oviedo, FL (US); Andrew J. Burns, Orlando, FL (US)

(73) Assignee: Siemens Energy, Inc., Orlando, FL (US)

( * ) Notice: Subject to any disclaimer, the term of this patent is extended or adjusted under 35 U.S.C. 154(b) by 523 days.

(21) Appl. No.: 12/327,348

(22) Filed: Dec. 3, 2008

(65) Prior Publication Data
US 2010/0078202 A1    Apr. 1, 2010

Related U.S. Application Data

(60) Provisional application No. 61/100,442, filed on Sep. 26, 2008.

(51) Int. Cl.
*H05K 1/00* (2006.01)
(52) U.S. Cl. .................. 174/257; 174/205; 174/258
(58) Field of Classification Search ............... None
See application file for complete search history.

(56) References Cited

U.S. PATENT DOCUMENTS

| | | | |
|---|---|---|---|
| 3,934,074 A | 1/1976 | Evelove et al. | |
| 4,299,873 A | 11/1981 | Ogihara et al. | |
| 4,336,551 A | 6/1982 | Fujita et al. | |
| 4,551,357 A | 11/1985 | Takeuchi | |
| 4,620,264 A | 10/1986 | Ushifusa et al. | |
| 4,694,687 A * | 9/1987 | Bonin et al. | 73/114.24 |
| 4,748,085 A | 5/1988 | Fukuda et al. | |
| 4,792,646 A | 12/1988 | Enomoto | |
| 4,993,148 A | 2/1991 | Adachi et al. | |
| 5,039,552 A | 8/1991 | Riemer | |
| 5,081,562 A | 1/1992 | Adachi et al. | |
| 5,108,027 A | 4/1992 | Warner et al. | |
| 5,122,930 A | 6/1992 | Kondo et al. | |
| 5,176,772 A | 1/1993 | Ohtaki | |
| 5,275,889 A | 1/1994 | Yokouchi et al. | |
| 5,287,620 A | 2/1994 | Suzuki et al. | |
| 5,290,606 A | 3/1994 | Hestevik et al. | |
| 5,290,971 A | 3/1994 | Hamaguchi et al. | |
| 5,294,750 A | 3/1994 | Sakai et al. | |
| 5,347,162 A | 9/1994 | Pasch | |
| 5,510,954 A * | 4/1996 | Wyler | 361/679.54 |
| 5,717,247 A | 2/1998 | Koh et al. | |
| 5,796,165 A | 8/1998 | Yoshikawa et al. | |
| 5,814,883 A | 9/1998 | Sawai et al. | |
| 6,020,048 A | 2/2000 | Oka et al. | |

(Continued)

FOREIGN PATENT DOCUMENTS

EP    0465199 A1    1/1992

(Continued)

*Primary Examiner* — Gregory Thompson

(57) ABSTRACT

A printed circuit board (PCB 22) capable of withstanding ultra high G forces and ultra high temperature as in a gas turbine (11). The PCB includes a substrate having a plurality of cavities (30A, 36A) formed therein for receiving components of a circuit, and conductors embedded in the PCB for electrically connecting the components together to complete the circuit. Each of the cavities has a wall (36A') upstream of the G-forces which supports the respective component in direct contact in order to prevent the development of tensile loads in a bonding layer (37A). When the component is an integrated circuit (50), titanium conductors (63) are coupled between exposed ends of the embedded conductors and contact pads on the integrated circuit. A gold paste (51) may be inserted into interstitial gaps between the integrated circuit and the upstream wall.

23 Claims, 3 Drawing Sheets

U.S. PATENT DOCUMENTS

| | | | |
|---|---|---|---|
| 6,055,151 | A | 4/2000 | Tormey et al. |
| 6,081,426 | A | 6/2000 | Takeda et al. |
| 6,359,234 | B1 | 3/2002 | Kouda |
| 6,362,964 | B1 | 3/2002 | Dubhashi et al. |
| 6,501,168 | B1 | 12/2002 | Castro et al. |
| 6,614,198 | B2 * | 9/2003 | Vaisanen ............... 318/434 |
| 6,930,256 | B1 | 8/2005 | Huemoeller et al. |
| 6,930,386 | B1 * | 8/2005 | Cesulka ................ 257/719 |
| 7,116,557 | B1 | 10/2006 | Raby et al. |
| 7,143,929 | B2 | 12/2006 | Furukuwa |
| 7,207,105 | B2 | 4/2007 | Miyai et al. |
| 7,240,429 | B2 | 7/2007 | Shiraishi et al. |
| 7,269,017 | B2 | 9/2007 | Berlin et al. |
| 7,309,838 | B2 | 12/2007 | Noguchi |
| 7,321,098 | B2 | 1/2008 | Sarma et al. |
| 7,339,278 | B2 | 3/2008 | Iksan et al. |
| 7,339,309 | B2 | 3/2008 | Okazaki et al. |
| 7,342,803 | B2 | 3/2008 | Inagaki et al. |
| 7,453,147 | B2 * | 11/2008 | Ida et al. ............... 257/723 |
| 7,909,312 | B2 * | 3/2011 | Ogata .................. 267/136 |
| 2004/0145044 | A1 | 7/2004 | Sugaya et al. |
| 2004/0202886 | A1 | 10/2004 | Subramanian |
| 2005/0038817 | A1 | 2/2005 | Huang et al. |
| 2005/0158511 | A1 | 7/2005 | Sabol et al. |
| 2005/0198967 | A1 | 9/2005 | Subramanian |
| 2005/0287386 | A1 | 12/2005 | Sabol et al. |
| 2006/0056960 | A1 | 3/2006 | Sabol et al. |
| 2007/0284706 | A1 | 12/2007 | Cherian |
| 2008/0054645 | A1 | 3/2008 | Kukkarni et al. |

FOREIGN PATENT DOCUMENTS

EP   0729180  A2   8/1996

* cited by examiner

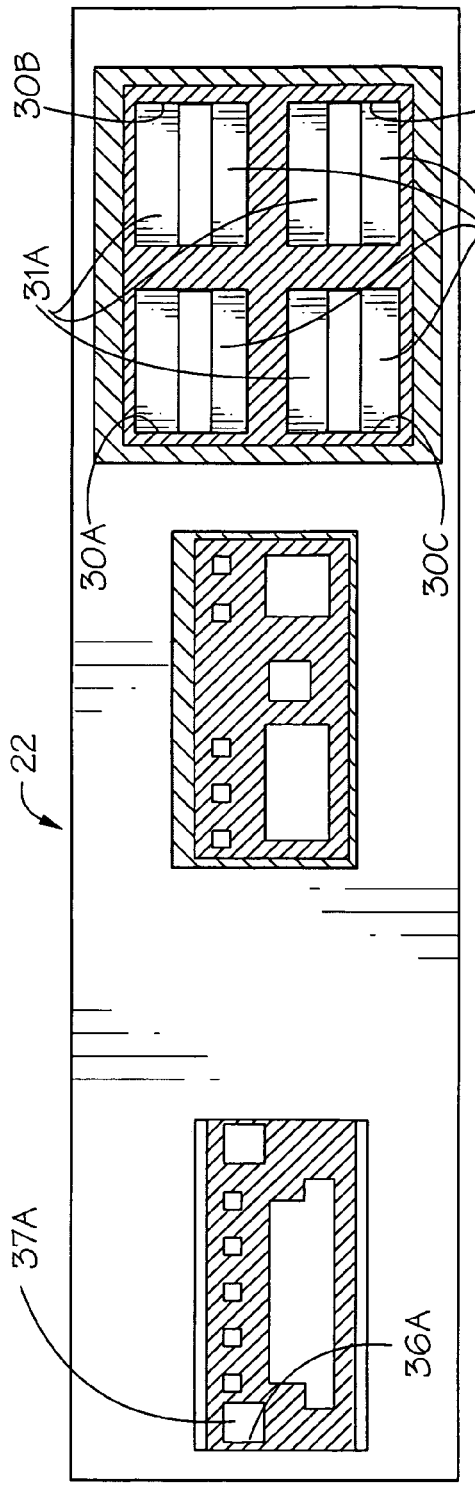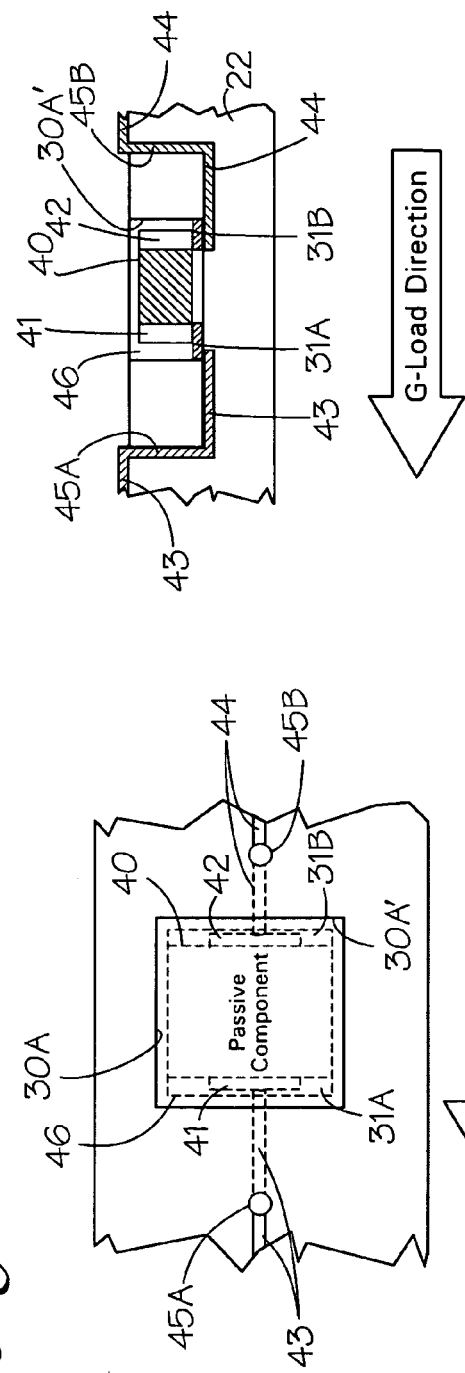

US 8,076,587 B2

PRINTED CIRCUIT BOARD FOR HARSH ENVIRONMENTS

This application claims benefit of the 26 Sep. 2008 filing date of U.S. provisional application No. 61/100,442.

FIELD OF THE INVENTION

The present invention generally relates to printed circuit boards (PCB) and in particular to a PCB structure designed to withstand the harsh environment of ultra high G-forces and ultra high temperature, such as occur on the rotating hot gas path components of a gas turbine engine.

BACKGROUND OF THE INVENTION

The temperatures inside an operating gas turbine engine are extremely high, often at levels in excess of 350° C. When it is desirable to monitor the inside temperatures of components of the turbine, such as a rotating turbine blade being exposed to thousands of G's, or to monitor stresses placed upon such components during operation, a special sensing, amplifying and transmitting circuit is required. An effective solution to this problem is the use of wireless telemetry, such as that disclosed in published U.S. Patent Application Publication No US 2005/0198967 A1 entitled SMART COMPONENT FOR USE IN AN OPERATING ENVIRONMENT. In that application, the general concept of using wireless telemetry circuitry on a moving component of a gas turbine engine is disclosed. The present patent application addresses specific problems encountered when implementing a PCB for housing and supporting the wireless telemetry circuitry, which PCB must be suitable for a harsh gas turbine environment.

One exemplary prior art device is disclosed in U.S. Pat. No. 5,081,562, entitled CIRCUIT BOARD WITH HIGH HEAT DISSIPATIONS CHARACTERISTIC. This patent teaches fabrication of a circuit board having a cavity for receiving an integrated circuit device and connecting leads from circuit traces on the top rim of the cavity to connection pads on the IC. This arrangement allows the connecting leads to lie flat. However, the attachment of the device to the circuit board is also stressed significantly when the PCB is exposed to centrifugal forces in the thousands of Gs. There is no suggestion or teaching of a structure that can withstand high G-forces Another exemplary prior art device is disclosed in U.S. Pat. No. 7,116,557 B1, entitled IMBEDDED COMPONENT INTEGRATED CIRCUIT ASSEMBLY AND METHOD OF MAKING SAME. This patent also teaches a circuit board having a cavity for receiving an integrated circuit device and connecting leads from circuit traces on the top rim of the cavity to connection pads on the IC. However, in this case the connecting leads are arched over to make an electrical connection. An encapsulating material such as silicon gel is added so as to fill the cavity and encapsulate the connecting leads. This arrangement ensures structural integrity during vibration and G-forces in the range of 10 G's but would not work in the range of thousands of G's. Moreover, the high temperature environment of a gas turbine exceeds the temperature capability of polymeric encapsulating materials, such as silicon gel or epoxy materials. High temperature capable encapsulating materials must be developed. Ceramic cements offer the potential to encapsulate electronics for high temperature use. However, the ceramic cement musty be carefully selected so as not to be electrically conductive at high temperature, particularly at radio frequencies, which would short out the radio frequency transmitter circuit.

BRIEF DESCRIPTION OF THE DRAWINGS

The invention is explained in the following description in view of the drawings that show:

FIG. 3 is a plan view of the high temperature PCB including cavities formed therein for receiving components, all according to the present invention.

FIG. 4 is a plan view of a passive component attached in a cavity of the PCB.

FIG. 5 is a cross-sectional view of the passive component shown in FIG. 4 attached in a cavity of the PCB.

DETAILED DESCRIPTION OF THE INVENTION

The inventors have recognized that the prior art PCB's are inadequate for the harsh environment of a gas turbine, and in particular are inadequate for the high G-forces of a turbine blade to which the PCB is attached. Applicants also have recognized that a better geometry is needed to support circuit components when subjected to extremely high G-forces.

The components of the circuitry supported by the PCB disclosed herein enable transmission of data via wireless telemetry circuits from regions of a gas turbine with temperatures ranging from ambient to greater than 350° C., and may include temperatures up to at least 450° C. This type of design strategy must be useful for incorporating instrumentation on a rotating hot section component, such as a gas turbine blade being subjected to G-forces in excess of 1,000 G's, because the PCB must be located on the turbine blade, and thus operate at temperatures exceeding 450° C.

Figure 1:
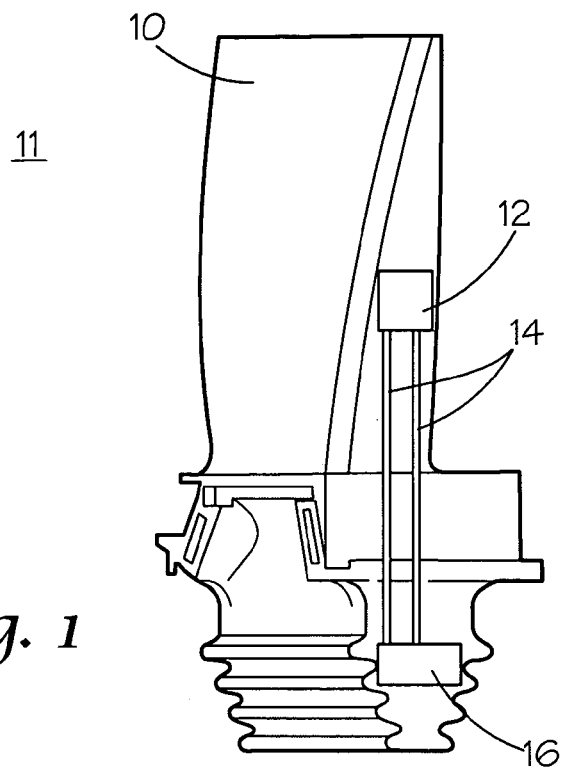
FIG. 1 is a perspective view of a turbine blade having a high temperature circuit package mounted thereon, which houses a high temperature circuit module including the PCB of the present invention.

One such instrumented moving hot section component that would enable collection of real-time temperature data is shown in FIG. 1, wherein a blade 10 of a turbine 11 has mounted thereon a sensor 12 and conductors 14 leading to a high-temperature electronics package 16, which processes and transmits data derived from the sensor 12 to a receiver circuit (not shown) external the turbine blade 10. As may be appreciated from FIG. 1 and the discussion above, the package 16, when mounted directly to the turbine blade 10, is subjected to extremely high temperatures and to extremely high G-forces, often in the tens of thousands of G's, from rotation of the turbine blade.

Figure 2:
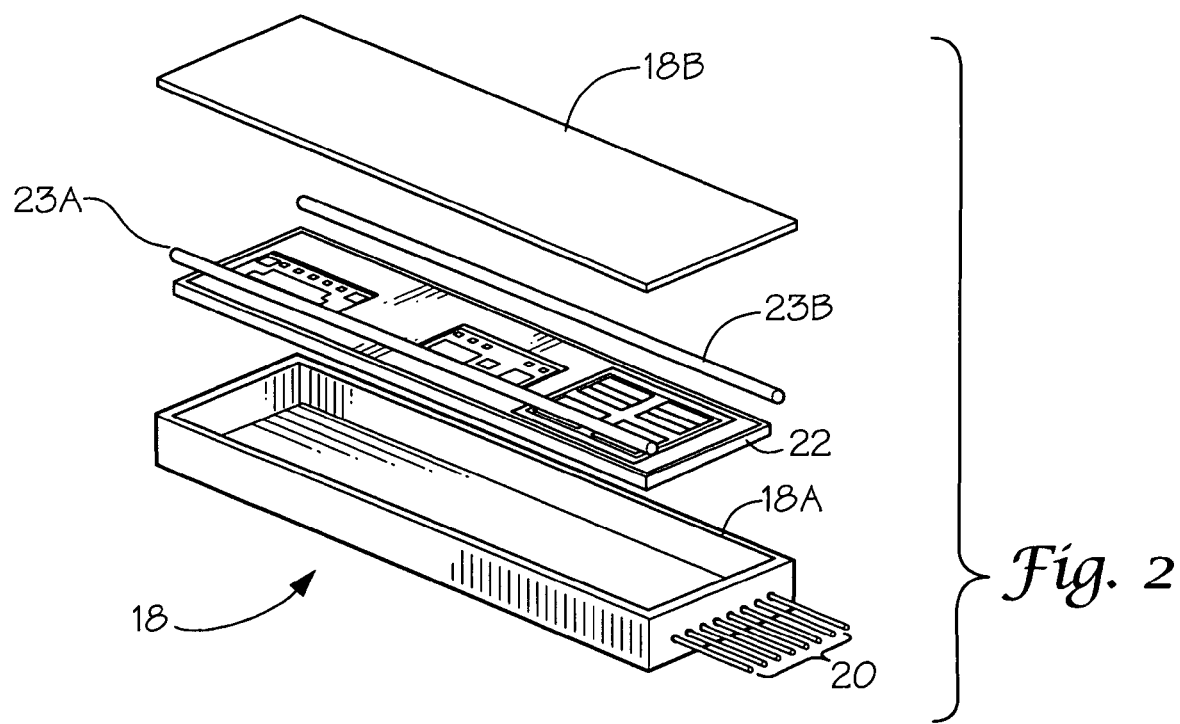
FIG. 2 is an exploded view showing the elements within the high temperature circuit module, including the PCB of the present invention.

Referring now to FIG. 2, an exploded view illustrates elements of a high temperature electronics module 18 that is secured within the high temperature electronics package 16. Module bottom 18A includes electrical connecting pins 20 extending from an end thereof to enable communication between the electronics inside the module 18 and external sensors, sources and antennae. In order to function at high temperatures up to at least 450° C., the package must be designed and sized to contain the electronic circuit and its substrate, hereinafter PCB 22. A pair of gold wires 23A and 23B are welded to the inside walls of the bottom 18A to secure the PCB 22 in place. A lid 18B is next secured to the top in order to completely enclose the module structure.

The module 18 must be able to withstand the temperature and centrifugal loading requirements and protect the circuitry on the PCB 22. Hence, the module 18A and lid 18B are made of gold-plated Kovar® alloy and the electrical connecting pins 20 are made of gold. Gold plating on the module cavity and lid prevents oxidation of the Kovar® alloy at elevated temperatures. The connectors 20 are insulated from the cavity 18A by means of individual insulating sleeves (not shown). A pair of the pins 20 is coupled to the electrical connectors 14 which communicate with the sensor 12, as shown in FIG. 2. The remaining pins may be coupled to ground potential, a source of power (two each for positive and negative ac), and to an antenna (not shown).

The disclosed PCB 22 is fabricated from materials capable of operation at high temperatures, for example high temperature capable materials, such as alumina, zirconia, silica, magnesia, titania, mullite, silicon carbide, silicon nitride, aluminum nitride, etc. The conductors and circuit traces in the PCB may be made of gold. The connecting pins 20 may be fabricated from platinum metal, which can withstand high temperature without melting or flexing excessively under the high G-forces. As will be discussed further hereinafter, a novel arrangement of the components within the PCB 22 provides a counter resistance to the high G-forces to which the PCB is subjected.

Referring now to FIG. 3, a plan view of the PCB 22 (unpopulated) is shown. Cavities 30A, 30B, 30C and 30D are formed for receiving capacitors (not shown in FIG. 3). Gold paste 31A, 31B is deposited on two sides of the bottom of the cavities 30A-30D for securing and making ohmic contact with each of four large capacitors. Each of the gold paste deposits makes ohmic contact with conductors (not shown) that are embedded in the PCB 22. As will be shown hereinafter, ceramic cement may be deposited over each of the capacitors in order to secure them in place.

Additional cavities, such as cavity 36A, are formed in the PCB 22 for receipt of active components, which in accordance with one embodiment are SiC JFET's. Gold paste 37A may be deposited in cavity 36A for securing the active component in place, and for making ohmic contact with circuitry embedded within the PCB 22. Multiple cavities may be formed in a similar manner in the PCB 22 for receipt of the remaining components of the circuitry.

Referring now to FIGS. 4 (plan view) and 5 (cross-sectional view), a typical passive component 40, for example a resistor or a capacitor, is shown secured within the cavity 30A. The component 40 has gold terminals 41 and 42, which terminals make ohmic contact with gold paste pads 31A and 31B that in turn make ohmic contact with conductors 43 and 44 that are embedded within PCB 22. The embedded conductors may continue through vias 45A and 45B to the PCB surface and connect with other circuitry (not shown). Finally, ceramic cement 46 (high temperature capable polymeric material with ceramic filler powder and binders) is placed over the component to secure it in place. The polymeric material may be a cross-linked polymer including filler powders and ceramic or metal adhesives employing binders to hold the particles together, or it may be a cross-linked epoxy including filler powders and ceramic or metal adhesives employing binders to hold the particles together. The filler powders may be selected from the group consisting of aluminum oxide, zirconium oxide, zirconium silicate, magnesium oxide, silicon dioxide, mica, graphite, silicon carbide, silicon nitride, aluminum nitride, aluminum, nickel and stainless steel.

The direction of G-force load in FIGS. 4 and 5, when viewed in a conventional manner, is from right to left. Hence, wall 30A', which is on the right-hand side of the cavity 30A in the figures, is the wall that will support or brace the component 40 (when enshrouded in the ceramic cement 46) in resistance to the applied G-force load. Wall 30A' is sometimes referred to herein as the wall upstream of the G-forces. It is also pointed out that the drawings are not drawn to scale and that the thickness of the ceramic cement adjacent the wall 30A' is much thinner than may appear. The thickness of the ceramic cement support layer may be less than 2 mm.

Figure 6:
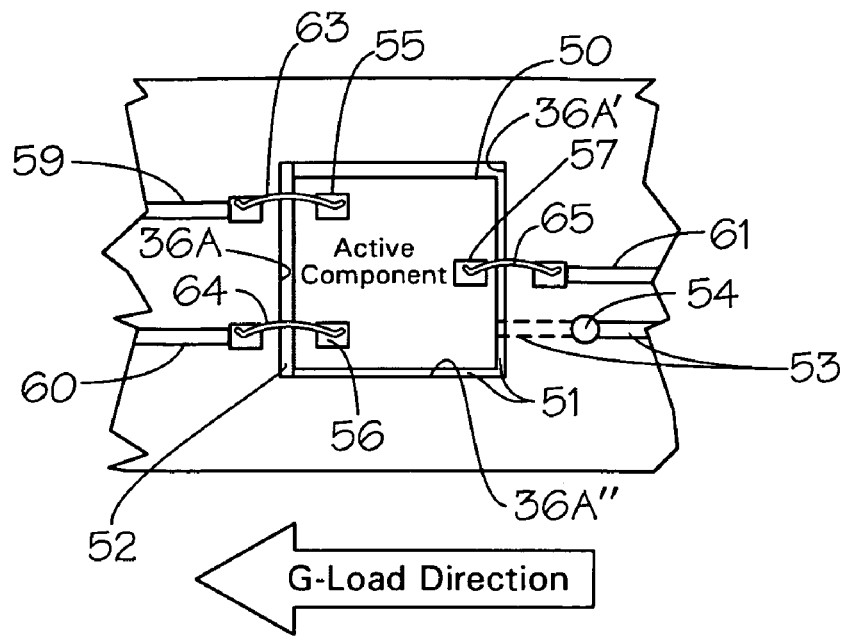
FIG. 6 is a plan view of an active component attached in a cavity of the PCB.

FIGS. 6 (plan view) and 7 (cross-sectional view) illustrate an active component 50 secured to the bottom of the cavity 36A by means of the gold paste 37A. It is noted that the direction of the G-force load in FIGS. 6 and 7, when viewed in a conventional manner, is from right to left. Hence, wall 36A', which is on the right-hand side of the cavity 36A in the figures, is the wall that will support or brace the component 50 in resistance to the applied G-force load. Wall 36A' is sometimes referred to herein as the wall upstream of the G-forces. Wall 36A", which is adjacent to wall 36A', also helps support the component 50 by resisting G-loads that are not strictly perpendicular to wall 36A', and thus wall 36A" may also be considered to be a wall upstream of G-forces. Accordingly, it may be appreciated that the component 50 is secured into a corner of the cavity 36A.

In this manner, extremely high G-loads may be resisted and carried into the base material of the PCB 22 in direct compression, without relying upon the strength of the bond between the gold paste 37A and the component 50. Prior art components lacking such direct contact support will develop a bending moment (compression on the upstream side and tensile on the downstream side) in the underlying bonding layer due to the vertical displacement of the center of gravity of the component above the plane of the underlying bonding surface. Even prior art components that were potted into place would develop such bending moments under very high G-loads (such as are experienced by turbine blades) due to the inherent flexibility of the posting material. The arrangement of the present invention avoids such bending moments/tensile loads in the underlying gold paste 37A by directly resisting all G-loads as compressive force along the side of the component 50 bearing on cavity wall 36A' (and optionally 36A").

Gold paste 51 may be coated on the walls of the cavity 36A and the component 50 pushed into a corner defined by walls 36A' and 36A". Gold paste 51 may also be placed into the space between the component 50 and the wall opposite the wall 36A". The gold paste 51 on the upstream wall 36A' (36A") of the cavity 36A is kept to a minimum thickness due to the fact that the upstream wall(s) directly support the component 50 against the extremely high G-load forces. The space between the component 50 and the side opposite the upstream side 36A' may be left open for allowance of any expansion/contraction of the component 50. Since the walls of the cavity 36A or the edges of the component 50 may not be perfectly planar or may not align precisely with the cavity, the gold paste 51 is used to fill in any interstitial gaps or small crevices between the device and the wall surfaces 36A' and 36A". It is noted again that the PCB 22 (and the components mounted therein) are subjected to extremely high G forces and any gap between the cavity 36A and the component 50 could dislodge the component as a result of twisting and resulting tensile forces. Accordingly, the gold paste serves to fill in any gaps that may occur and to firmly secure the component in place. It is also pointed out that the drawings are not to scale and that the thickness of the gold paste adjacent the wall 36A' or 36A" is much thinner than it appears in the figures. The thickness of the gold paste may be less than 2 mm.

Figure 7:
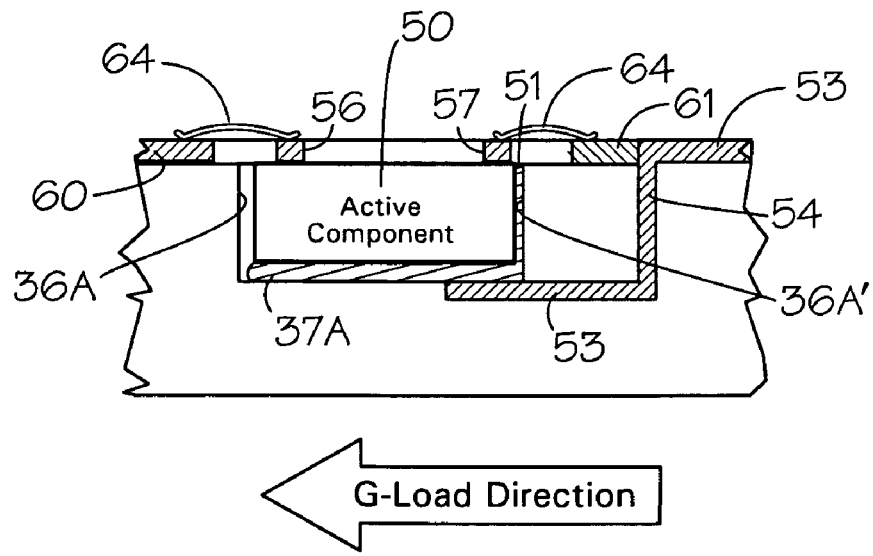
FIG. 7 is a cross-sectional view of the active component shown in FIG. 6 attached in a cavity of the PCB.

As may be seen in the cross-sectional view of FIG. 7, the gold paste (die attach) 37A makes ohmic contact with an embedded conductor 53. The conductor 53 may continue up to the surface of the PCB by means of via 54. Contact pads 55, 56, and 57 on the top surface of the component 50 are coupled to other surface conductors 59, 60, and 61, respectively, by means of bonding conductors or ribbons 63, 64 and 65. The ribbons 63, 64, and 65 may be affixed to the contact pads 55, 56, and 57, respectively, by means of thermosonic welding. Likewise, the other end of the ribbons 63, 64, and 65 are affixed to the conductors 59, 60, and 61, respectively, by thermosonic welding. It is noted that the component shown in FIGS. 6 and 7 is illustrative only, and in most cases active components include many more contact pads and bonding conductors than is shown herein.

Figure 8:
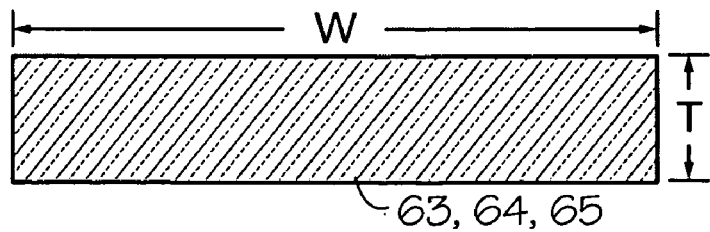
FIG. 8 is a cross section of a connection ribbon used in connecting contact pads of an active component to circuitry within the PCB.

According to an embodiment, the bonding conductors or ribbons 63, 64 and 65 are made of platinum. It is pointed out that alignment of the ribbons 63, 64 and 65 is parallel to the G-load forces. This arrangement minimizes any warping of the ribbons due to the heavy G-loading, which warping could be more severe if the ribbons were aligned perpendicular to the G-loading. A cross-sectional view of a typical ribbon is shown in FIG. 8. The ribbons 63, 64, and 65 are typically made with an aspect ratio (W/T) of something greater than 1:1, such as an aspect ratio of 5:1 or between 1:1 and 5:1. This is preferred in order for the ribbons to withstand the extremely high G-forces exerted on the PCB 22 and the component 50 buckling or warping. Other metals suitable for the ribbons 63, 64 and 65 include Ni, Pt, Pd, Ti, Ta, W, etc.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

What is claimed is:

1. A printed circuit board capable of withstanding an ultra high G force as in a rotating component of a gas turbine, said printed circuit board comprising:
    a substrate defining a cavity formed therein for receiving a component of a circuit;
    conductors embedded in said substrate for electrically connecting to said component to complete said circuit; and
    a wall of said cavity upstream of said G-force being disposed adjacent to said component to resist said G-force in compression.

2. The board as in claim 1 wherein said substrate is made of a high temperature capable ceramic selected from the group consisting of alumina, zirconia, silica, magnesia, titania, mullite, silicon carbide, silicon nitride and aluminum nitride.

3. The board as in claim 1 wherein said embedded conductors comprise gold.

4. The board as in claim 1 wherein the component is an integrated circuit, and further comprising bonding conductors between exposed ends of said embedded conductors and respective contact pads on said integrated circuit being made of a metal selected from the group consisting of platinum, nickel, palladium, titanium, tantalum, and tungsten.

5. The board as in claim 4 further comprising gold paste inserted into interstitial gaps between said integrated circuit and the upstream wall of said cavity.

6. The board as in claim 4 wherein said bonding conductors are rectangular in cross section having an aspect ratio greater than 1:1.

7. The board as in claim 4 wherein said bonding conductors are rectangular in cross section having an aspect ratio between 1:1 and 5:1.

8. The board as in claim 1 wherein said component is attached to the bottom of said cavity by a gold paste.

9. The board as in claim 1 further comprising a ceramic cement surrounding the component within the cavity.

10. A printed circuit board for use on a rotating part of a gas turbine engine and being capable of withstanding the ultra high G-forces and the ultra high temperature of said gas turbine engine, said printed circuit board comprising:
    a high temperature capable ceramic substrate having a plurality of cavities formed therein for receiving components of a circuit and gold conductors embedded in said substrate for electrically connecting said components together to form said circuit; and,
    select ones of said cavities having gold paste on the bottom thereof for attaching said components; and
    at least one wall of said cavities upstream of said G-forces being disposed to support said respective components when subjected to said G-forces.

11. The board as in claim 10 wherein said ceramic substrate is made of a material selected from the group consisting of alumina, zirconia, silica, magnesia, titania, mullite, silicon carbide, silicon nitride and aluminum nitride.

12. The board as in claim 10 where one of said components is an integrated circuit, and further including bonding conductors between exposed ends of said embedded conductors and contact pads on said integrated circuit, said bonding conductors being made of a metal selected from the group consisting of platinum, nickel, palladium, titanium, tantalum, and tungsten.

13. The board as in claim 12 further comprising gold paste inserted into interstitial gaps between said integrated circuit and said at least one upstream wall.

14. The board as in claim 12 wherein said bonding conductors are rectangular in cross section having an aspect ratio greater than 1:1.

15. The board as in claim 12 wherein said bonding conductors are rectangular in cross section having an aspect ratio of between 1:1 and 5:1.

16. In a telemetry system for use in a high temperature and high G-force environment, a circuit module affixed to a moving part and disposed for receiving information sensed about a condition of said part and transmitting said received information to a receiver external to said environment, said circuit module being adapted for the high temperature and high G-force environment and comprising:
    a high-temperature resistant package adapted for attachment to said part;
    a ceramic substrate for supporting both active and passive components of a circuit, said substrate comprising a plurality of cavities formed therein for receiving the active or passive components of said circuit, and conductors for electrically connecting said components together to complete said circuit; and,
    said cavities having respective walls upstream of said G-force and being disposed to support said respective components in compression when subjected to said G-force.

17. The circuit module as in claim 16 wherein the upstream walls include a first upstream wall, and wherein each cavity further comprises a second upstream wall abutting said respective first upstream wall thereby forming a corner disposed for supporting said respective components in compression when said G-force is not normal to either of said respective upstream walls.

18. A printed circuit board capable of withstanding an ultra high G-force as in a rotating component of a gas turbine, said printed circuit board comprising:
   a high temperature capable ceramic substrate having one or more cavities a cavity, wherein said cavity has a wall upstream of a G-force;
   a component of a circuit disposed within the cavity and attached to a bottom of the cavity and the upstream wall, wherein the upstream wall supports said component in compression when subjected to said G-force;
   a plurality of discrete conductors on a surface of the substrate and each conductor having a terminus adjacent to the cavity; and,
   a plurality of bonding conductors, each bonding conductor extending between a contact pad on a the component and a respective conductor terminus on the surface of the substrate.

19. The board as in claim 18 wherein the bonding conductors are aligned parallel to the G-force.

20. The board as in claim 18 wherein ceramic cement is disposed between the bottom of the respective cavity and the component, and between the upstream wall and the component to attach the component to the substrate.

21. The board as in claim 18 wherein each upstream wall is a respective first upstream wall, and wherein each cavity further comprises a second upstream wall abutting said respective first upstream wall thereby forming a corner disposed for supporting said respective components in compression when said G-force is not normal to either of said respective upstream walls.

22. The board as in claim 18 wherein the printed circuit board is a component of a circuit module affixed to a moving part and disposed for receiving information sensed about a condition of said part and transmitting said received information to a receiver external to said part.

23. The board as in claim 18 further comprising a conductor embedded in said substrate for electrically connecting to at least one of said components to complete said circuit.

* * * * *

UNITED STATES PATENT AND TRADEMARK OFFICE Certificate

Patent No. 8,076,587 B2　　　　　　　　　　　　　　　　　　　　　　　Patented: December 13, 2011

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: David J. Mitchell, Oviedo, FL (US); Anand A. Kulkarni, Oviedo, FL (US); Andrew J. Burns, Orlando, FL (US); John R. Fraley, Fayetteville, AR (US); Byron P. Western, West Fork, AR (US); and Brice R. McPherson, Fayetteville, AR (US).

Signed and Sealed this Twenty-first Day of May 2013.

<div style="text-align:right">

JAYPRAKASH N. GANDHI
*Supervisory Patent Examiner*
Art Unit 2835
Technology Center 2800

</div>